(12) United States Patent
Terabe

(10) Patent No.: US 8,307,312 B2
(45) Date of Patent: Nov. 6, 2012

(54) SIMULATION METHOD OF LOGIC CIRCUIT

(75) Inventor: Miki Terabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 813 days.

(21) Appl. No.: 12/190,477

(22) Filed: Aug. 12, 2008

(65) Prior Publication Data

US 2009/0048818 A1  Feb. 19, 2009

(30) Foreign Application Priority Data

Aug. 16, 2007  (JP) ................................. 2007-212127

(51) Int. Cl.
*G06F 17/50* (2006.01)
(52) U.S. Cl. .......................... 716/105; 716/106; 716/108
(58) Field of Classification Search .................. 716/108, 716/106, 105
See application file for complete search history.

(56) References Cited

U.S. PATENT DOCUMENTS

| | | | |
|---|---|---|---|
| 5,768,159 A * | 6/1998 | Belkadi et al. .................. | 703/19 |
| 6,434,728 B1 | 8/2002 | Arayama et al. | |
| 6,557,150 B1 * | 4/2003 | Honmura et al. ............. | 716/113 |
| 7,451,412 B2 * | 11/2008 | Jones et al. .................... | 716/103 |

FOREIGN PATENT DOCUMENTS

| | | |
|---|---|---|
| JP | 1-240998 | 9/1989 |
| JP | 10-63693 | 3/1998 |
| JP | 11-296575 | 10/1999 |
| JP | 2001-76020 | 3/2001 |

OTHER PUBLICATIONS

Japanese Office Action issued Dec. 20, 2011 in corresponding Japanese Patent Application No. 2007-212127.

* cited by examiner

*Primary Examiner* — Vuthe Siek
*Assistant Examiner* — Mohammed Alam
(74) *Attorney, Agent, or Firm* — Staas & Halsey LLP

(57) ABSTRACT

A simulation method of a logic circuit is provided. The simulation method includes operations dividing the logic circuit into a plurality of divided circuits, determining the divided circuit constructing a path circuit of the logic circuit, determining an auxiliary divided circuit that is the divided circuit not constructing the path circuit and affects on a simulation result of the path circuit. The method also includes executing a simulation calculation of a part of the circuit including the divide circuit constructing the path circuit and the auxiliary divided circuit.

9 Claims, 14 Drawing Sheets

FIG. 12
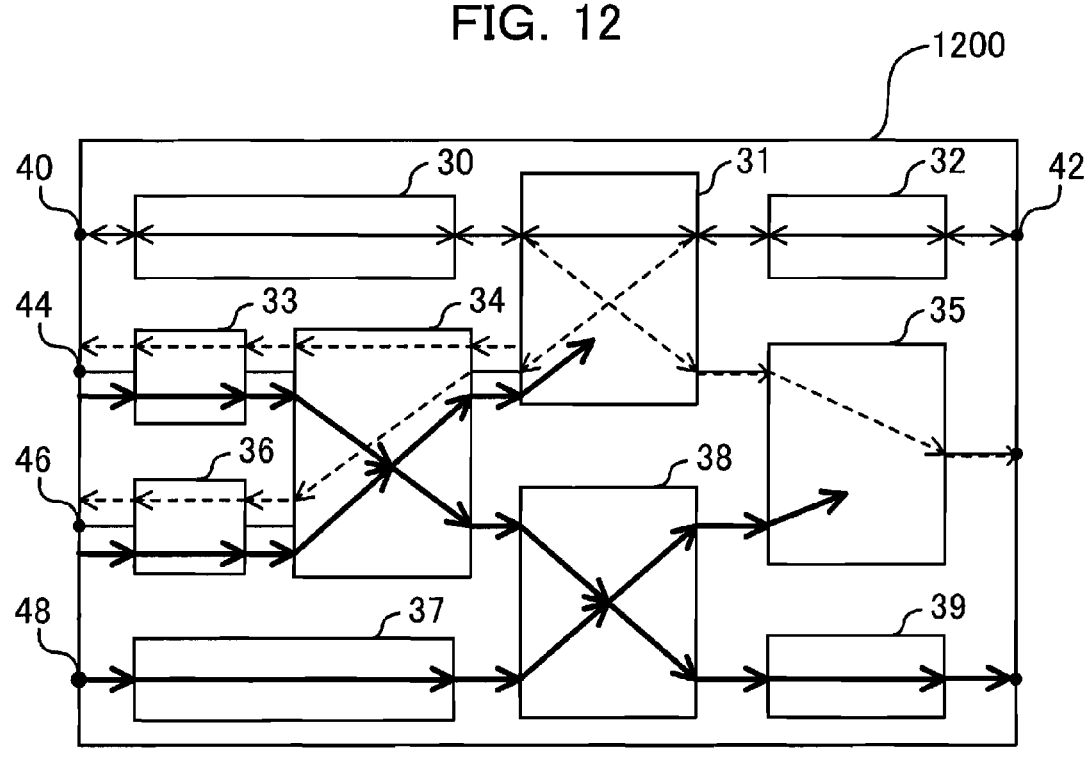
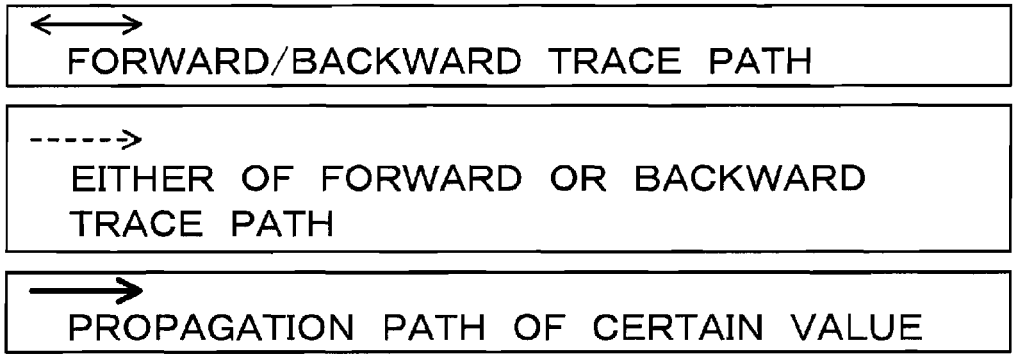

← → PATH THAT TRACES BOTH FORWARD/ BACKWARD TRACE PATHS

→ PROPAGATION PATH OF CERTAIN VALUE

US 8,307,312 B2

SIMULATION METHOD OF LOGIC CIRCUIT

CROSS-REFERENCE TO RELATED APPLICATION

This application is related to and claims priority to prior Japanese Patent Application No. 2007-212127, filed on Aug. 16, 2007, and incorporated by reference herein.

BACKGROUND

1. Field

The embodiments discussed herein are directed to a simulation method of a logic circuit including transistor circuit and custom macro circuit like RAM macro, devices, and a program for a timing analysis of the logic circuit.

2. Description of the Related Art

For a logic circuit containing a macro repeatedly used in an ultrahigh-speed LSI with a clock frequency of greater than several of GHz, an accurate timing analysis may be required at a phase of designing. One of the timing analysis conditions may be to analyze whether a circuit satisfies certain timing conditions. Based on a result of the timing analysis, a circuit such as a driver circuit may be selected. Conventionally, a method of the timing analysis, SPICE (Simulation Program with Integrated Circuit Emphasis), an industry standard simulation tool, has been used. However, the timing analysis with SPICE takes a lot of time, thus it is unpractical to conduct the analysis of a currently used logic circuit having a large number of transistors, e.g., several millions of transistors like RAM macro within a reasonable time.

Conventionally, there has been a timing analysis method that divide a circuit to be analyzed into small blocks, conduct simulations with SPICE for each divided block and then the results is stored in a library format, and then, conduct a static timing analysis (STA) on the whole circuit by using the created libraries for each block.

However, this conventional method is unable to obtain a satisfactory result on the analysis of a path required high degree of accuracy. In addition, since this analysis analyzes all paths of the circuit even where analyzing only a specific path. Thus, processing time becomes a bottleneck.

SUMMARY

It is an aspect of the embodiments discussed herein to provide a simulation method of a logic circuit containing transistor circuit and custom macro circuit like RAM macro, including the operations of dividing the logic circuit into a plurality of divided circuits, determining the divided circuit constructing a path circuit of the logic circuit, determining an auxiliary divided circuit that is the divided circuit not constructing the path circuit and affects on a simulation result of the path circuit; and executing a simulation calculation of a part of the circuit including the divide circuit constructing the path circuit and the auxiliary divided circuit.

These together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 12 illustrates a path circuit extraction;

DETAILED DESCRIPTION OF THE EMBODIMENTS

Figure 1:
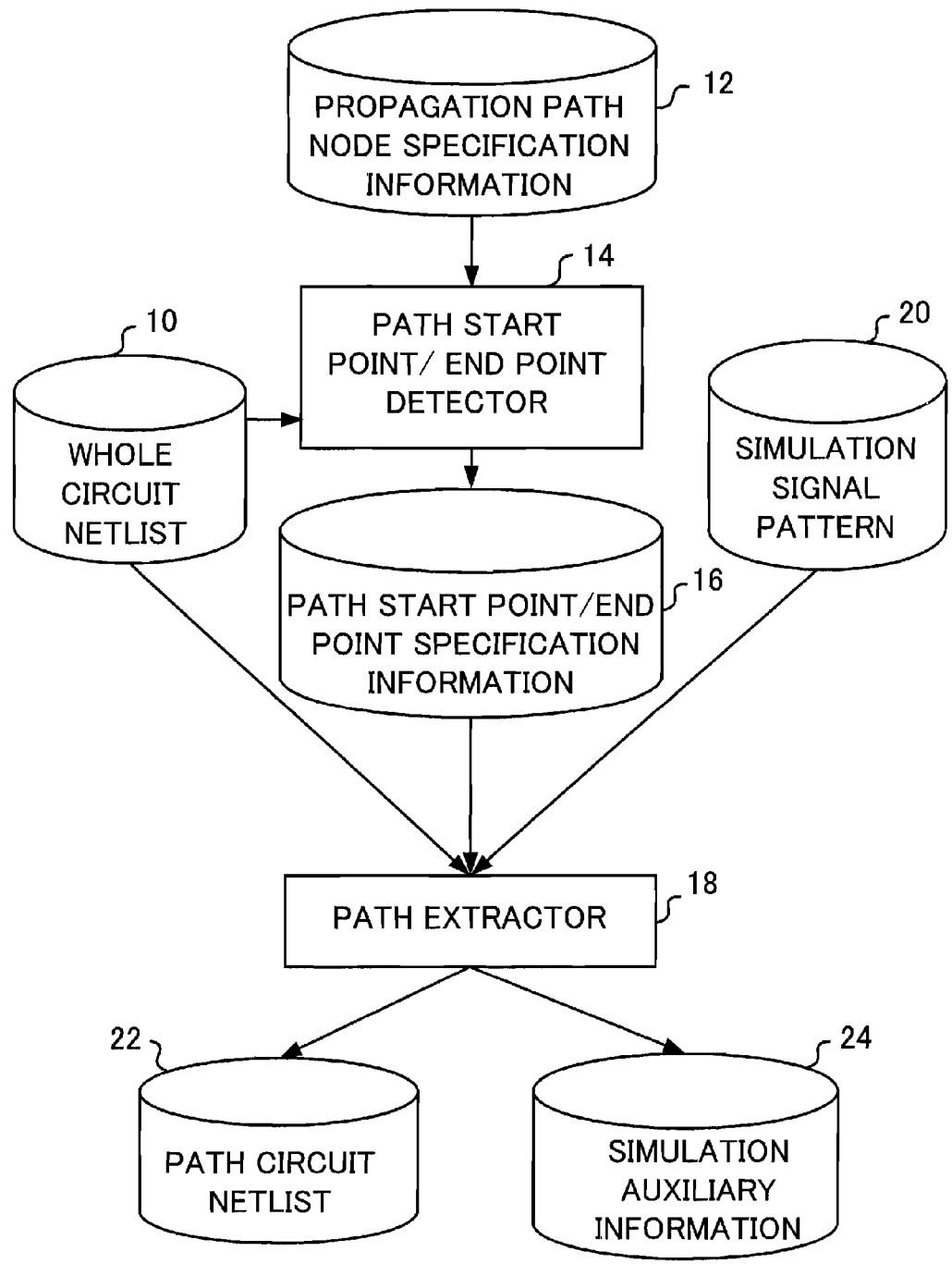
FIG. 1 illustrates an example of structure of a system executing a simulation in an embodiment.

FIG. 1 illustrates an example of a system executing a simulation in an example embodiment. The system illustrated in FIG. 1 is a system that may be dedicated for extraction of a requisite minimum part from a circuit for a timing analysis to execute accurate simulation by a tool, for example such as SPICE.

Figure 2:
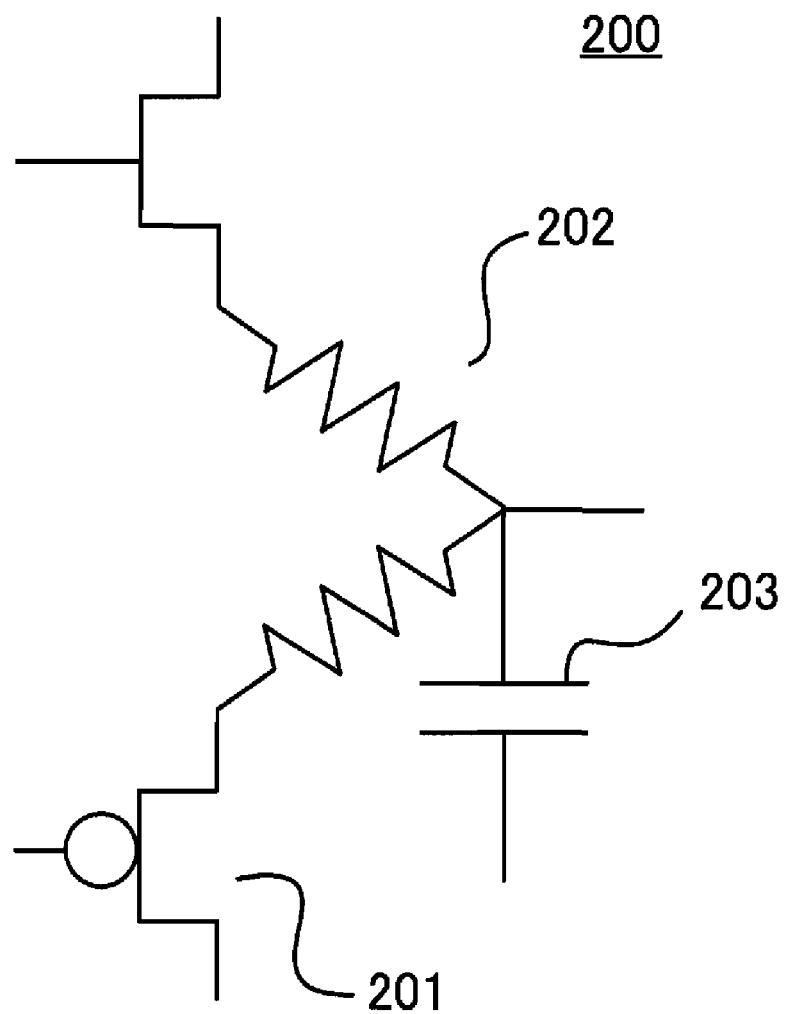
FIG. 2 illustrates a net list at a layout level.

A whole circuit net list 10 may be a net list, for example as defined as a SPICE model, showing connection between circuit elements 200 such as a transistor 201, a resistance 202 and a capacitor 203 illustrated in FIG. 2. A propagation path node specification information 12 is the information to identify a node which is specified by a user along an arbitrary path, where simulating a path having the node. The node specified by the user is hereinafter referred to as "identified node". A path start point/end point detector 14 determines path start point/end point specification information 16 identifies a start point and an end point of the path targeted for the timing analysis according to the whole circuit net list 10 and the propagation path propagation path node specification information 12.

The start point and the end point of the path targeted for the simulation may be specified by the user instead of using the propagation path node specification information 12. Where the node is specified by the user directly, the propagation path node specification information 12 may be unnecessary.

A path extractor 18 extracts a path in the circuit for the timing analysis according to the whole circuit net list 10, the path start point/end point specification information 16 and a simulation signal pattern 20 providing possible combinations of input values input to an external input terminal of the circuit excluding the start point of the path. The simulation signal pattern 20 represents simulation conditions. The path extractor 18 extracts a part of the circuit that is necessary for the timing analysis from the whole circuit net list 10 based on specific conditions, and then output a path circuit net list 22 and simulation auxiliary information 24.

The path circuit net list 22 represents connections between the circuit elements of the path extracted by the path extractor 18. The simulation auxiliary information 24 provides information on circuits along the path extracted.

Figure 3:
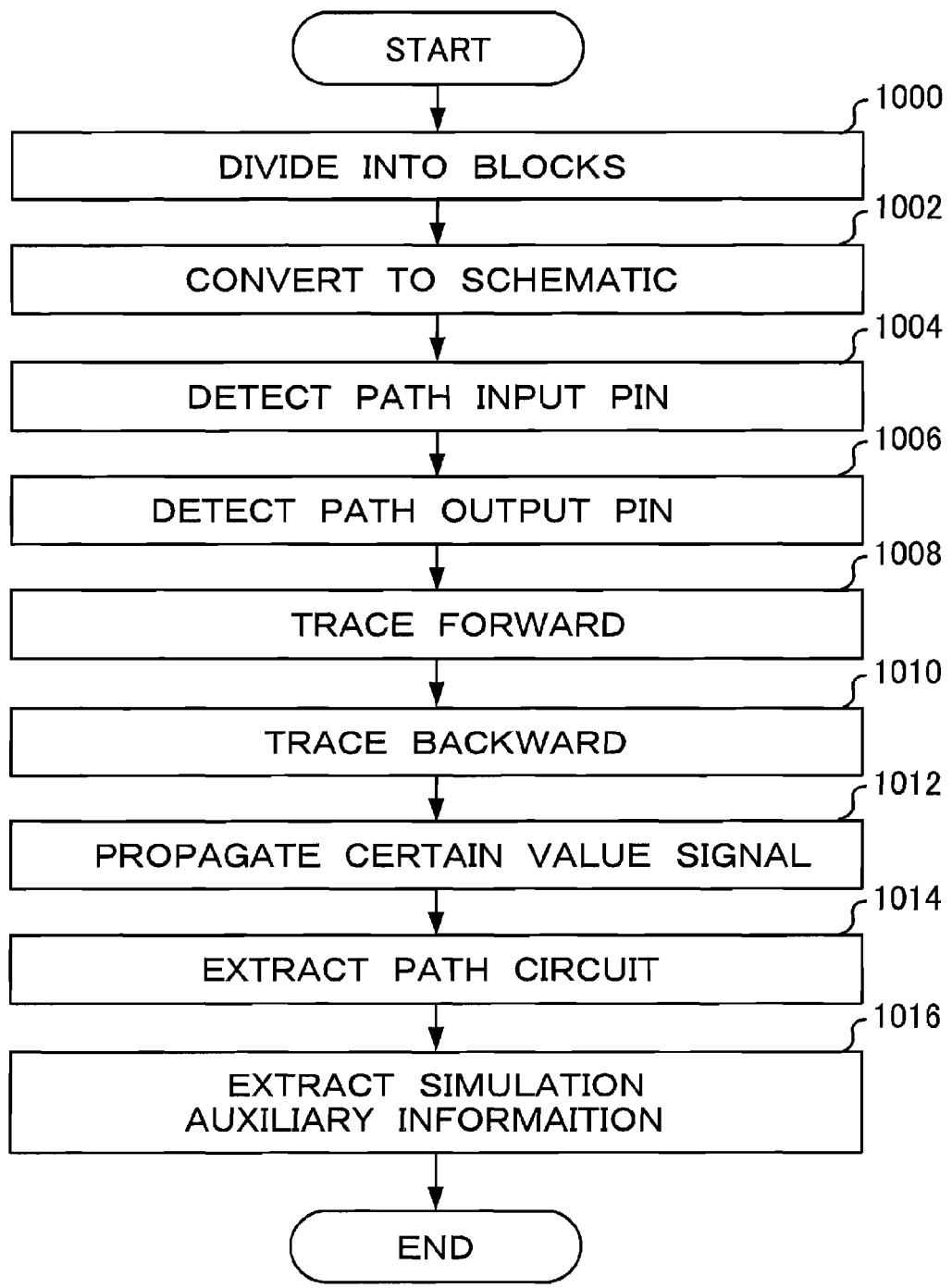
FIG. 3 illustrates an example of behaviors of the system illustrated in FIG. 1.
Figure 4:
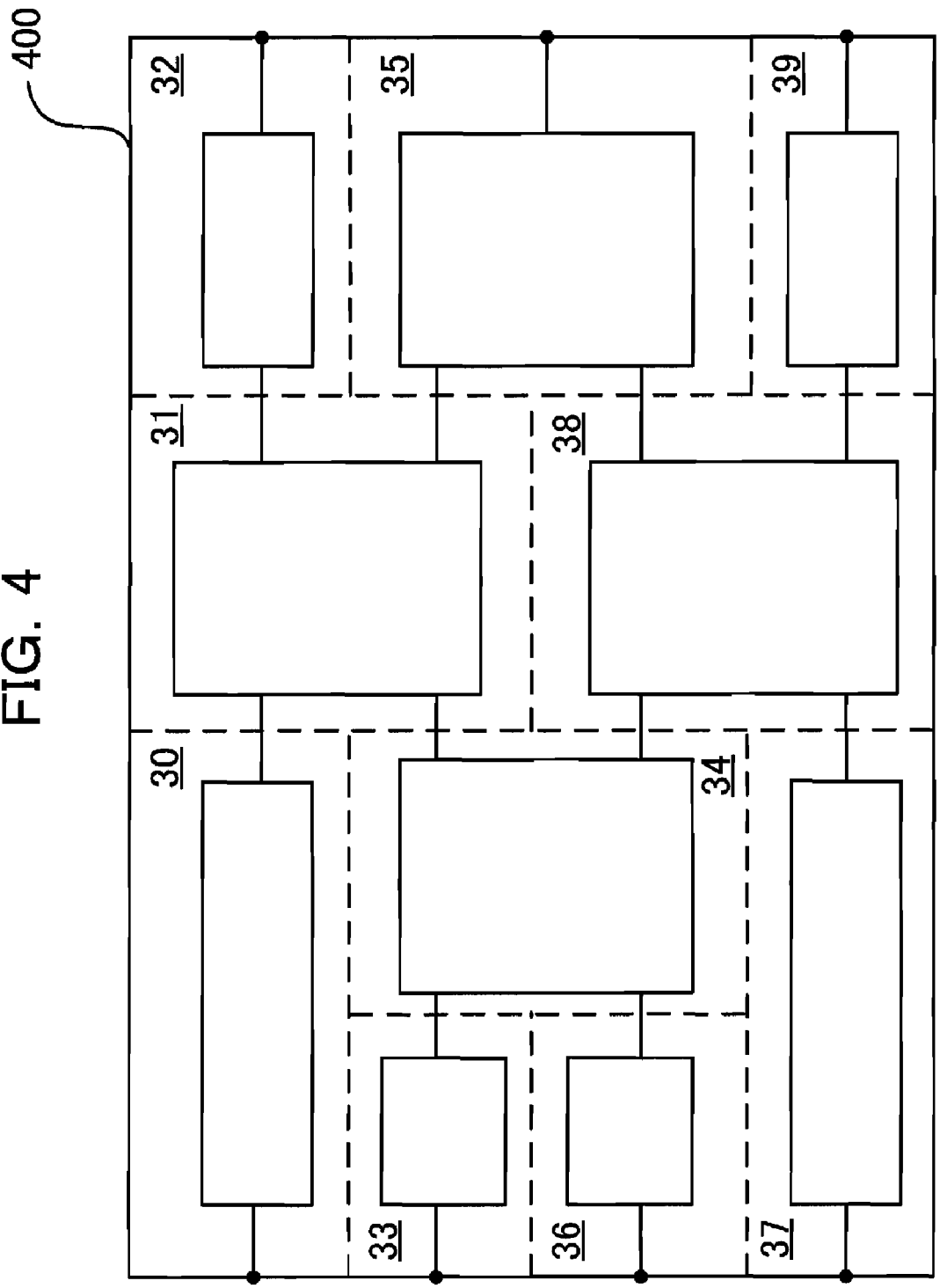
FIG. 4 illustrates example circuit divisions.

FIG. 3 illustrates an example of a process that processed by the path start point/end point detector 14 and the path extractor 18 illustrated in FIG. 1. In operation 1000, a whole logic circuit 400 identified by the whole circuit net list 10 may be divided into a plurality of blocks 30 to 39 (hereinafter referred as to "a divided circuit") indicated with dashed line as illustrated in FIG. 4. The division units may be functions of each circuit element such as NOT, NAND, OR. In FIG. 4, ten example divided circuits are illustrated. However, as described above, the logic circuit may be divided in units, e.g., of functions, which means that a logic circuit may divided into a large number of divisions.

Figure 5A:
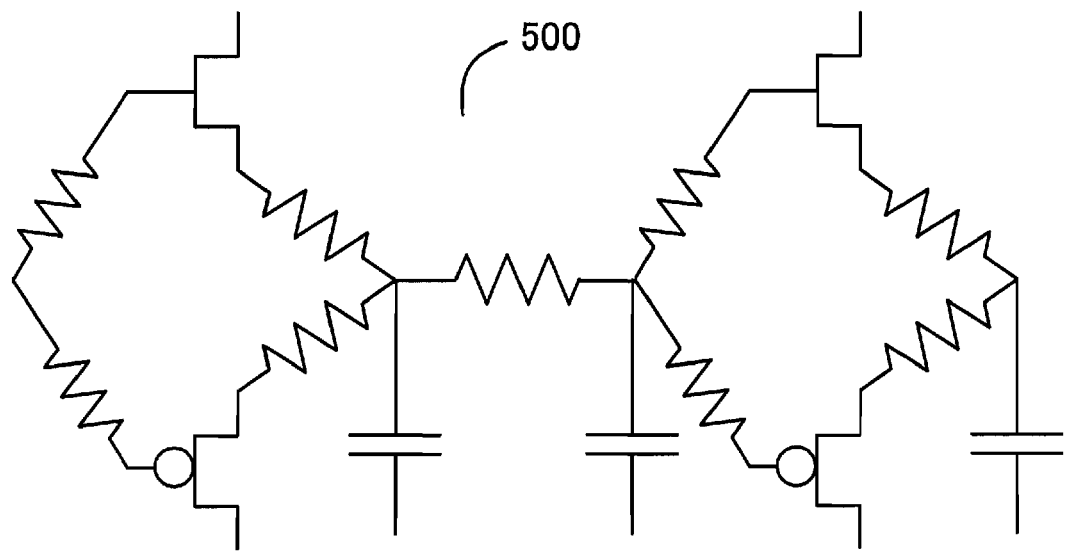
FIGS. 5A and 5B illustrate a conversion of a net list from the layout to a schematic.
Figure 5B:
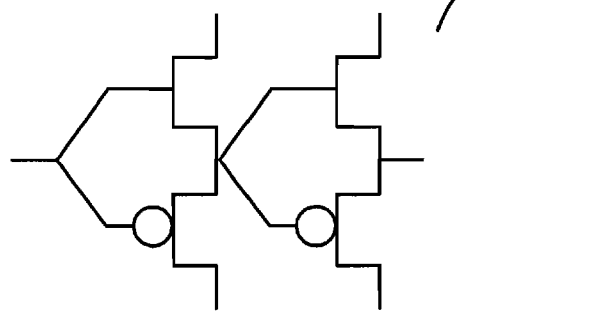

In operation 1002 illustrated in FIG. 3, the divided circuits are converted from the layouts 500 as illustrated in FIG. 5A to schematics 510 as illustrated in FIG. 5B. As illustrated in FIG. 5A, resistors representing resistances of the wiring and capacitors representing capacitances of the wiring are illustrated. The illustrated resistors and capacitors are included in the circuit as layouts. Meanwhile, a schematic illustrated in FIG. 5B, resistors and capacitors are not illustrated. Where a propagation path node targeted for the simulation is specified, path input pins are detected through a path starts from the specified internal node in operation 1004, and path output pins are detected in operation 1006. A process of pin detection will be discussed later. Where the user specifies the path input pin that is the start point of the path and the path output pin that is the end point of the path directly, operations 1004 and 1006 may be omitted.

Figure 6:
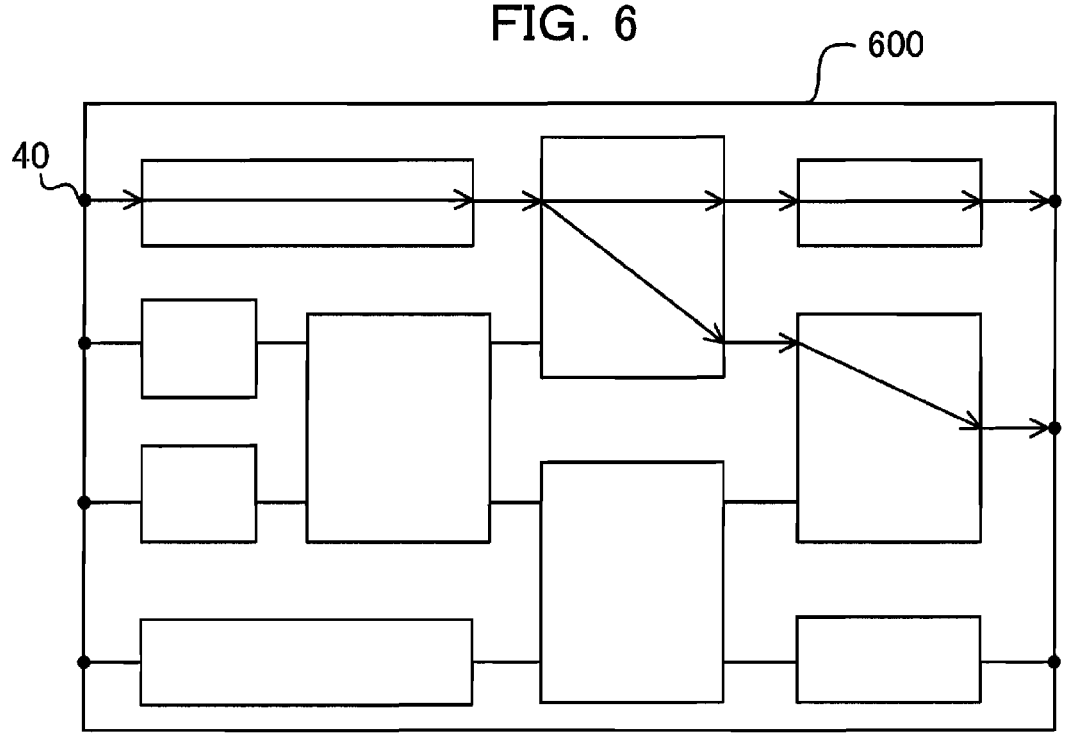
FIG. 6 illustrates an example of a circuit traced forward.
Figure 7:
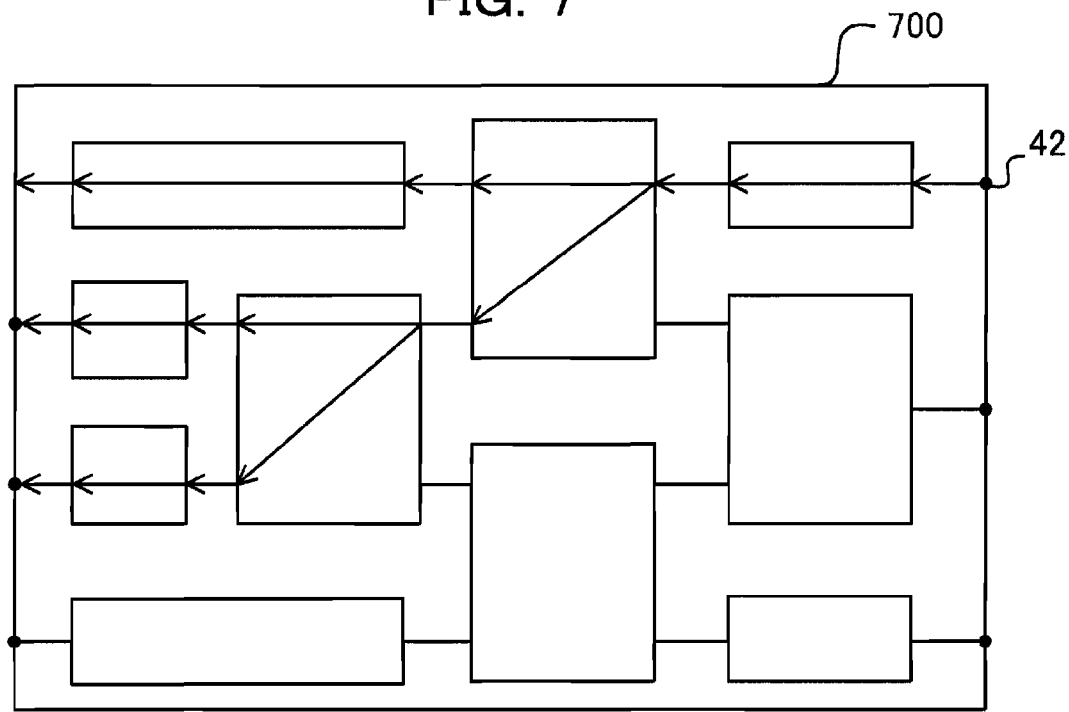
FIG. 7 illustrates an example of the circuit traced backward.
Figure 8:
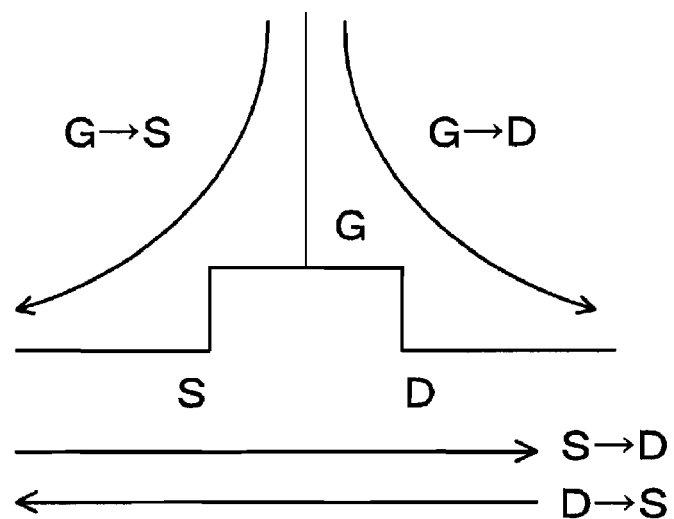
FIG. 8 illustrates an example of a transistor traced forward.
Figure 9:
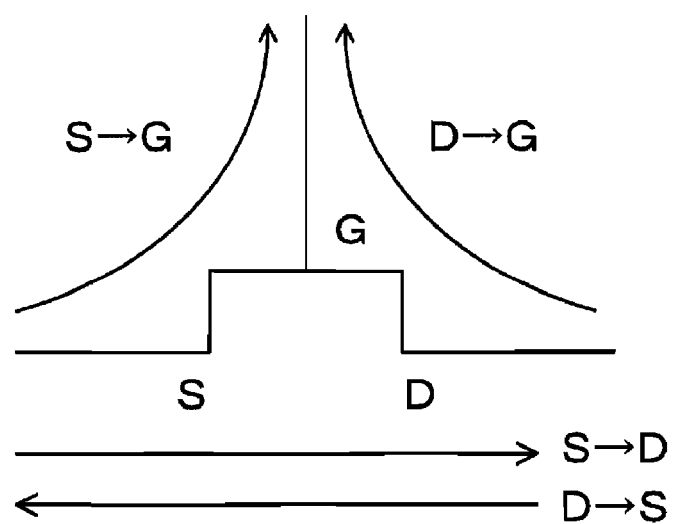
FIG. 9 illustrates and example of a transistor traced backward.

In operation 1008, the circuit is traced forward from the path input pin detected in operation 1004, or a path input pin directly specified by the user as illustrated in FIG. 6. Thereafter, in operation 1010, the circuit is traced backward from the path output pin as a start point as illustrated in FIG. 7. FIGS. 6 and 7 conceptually show circuits 600 and 700 traced forward and backward where the path input pin is an external input pin 40, and the path output pin is an external output pin 42 Actual circuit may be traced forward or backward along with wire connections in the divided circuit or wire connections between the divided circuits. As illustrated in FIG. 8, each transistor constructing the divided circuit is traced forward from G (gate) to S (source), from G to D (drain), from S to D or from D to S. The transistors traced forward are stored as first candidates of the transistors constructing the path circuit. Similarly, as illustrated in FIG. 9, each transistor is also traced backward from S to G, from D to G, from S to D and from D to S. The transistors traced backward are stored as second candidates of the transistors constructing the path circuit.

In operation 1012, an unknown value X is input to the input pin 40 that is the start point of the path, and a certain value 0 or 1 representing the simulation condition is input to other pins 44, 46 and 48. Then the certain value and the unknown value are propagated through the circuit based on the logic of the circuit. For instance, where certain value 0 and the unknown value X are input to the divided AND circuit, the unknown value 0 is propagated to the output of the divided circuit based on the logical AND. Similarly, where certain value 1 and the unknown value X are input to the divided AND circuit, the unknown value X is propagated to the output of the divided AND circuit.

Figure 10:
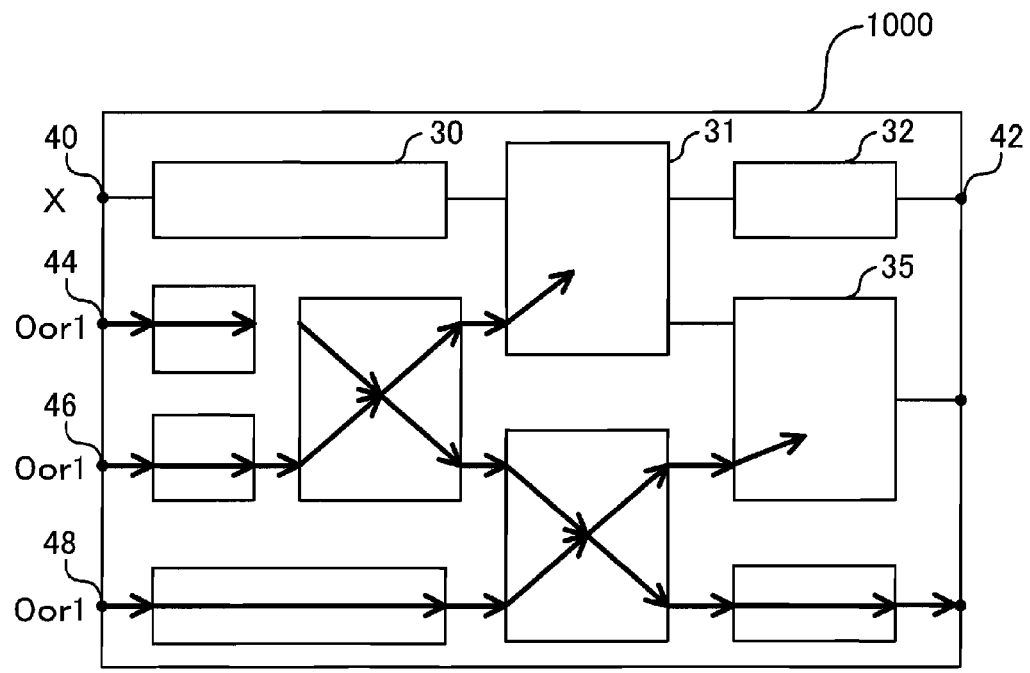
FIG. 10 illustrates an example of a certain value propagation.
Figure 11A:
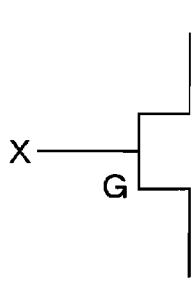
FIGS. 11A, 11B, and 11C illustrate example transistors to which the certain value is not propagated effectively.
Figure 11B:
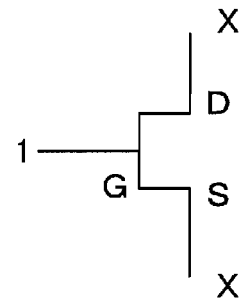
Figure 11C:
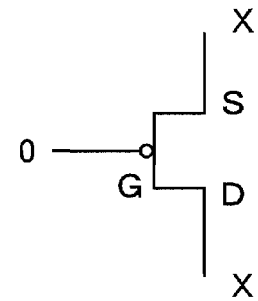

FIG. 10 illustrates the certain value 0 or 1 propagated across the circuit 1000 through divided circuits with arrows. Consequently, transistors that cannot determine on/off state in the circuit because the gate terminals values generate the unknown value X at the outputs as illustrated in FIG. 11A are detected. Likewise, transistors that do not generate the certain values at drain terminals or source terminals even where the on/off state are determined as illustrated in FIGS. 11B and 11C are detected. In this embodiment, theses transistors are stored as third candidates of the transistors constructing the path circuit. FIG. 10 conceptually illustrates that the certain value 0 or 1 is propagated and there are transistors to which the certain value cannot be propagated effectively. For instance, any certain value is not input to a divided circuit 30. For a divided circuit 31, the certain value is propagated, however, the certain value is not outputted. This means that there are the transistors to which the certain value is not effectively propagated in the divided circuits 30 and 31.

Then, in operation 1014, the transistors that are included in the first to the third candidates, in other words, the divided circuits that are traced forward once and backward once and containing at least one transistor to which the certain value is not propagated effectively are extracted. Thus, the divided circuits constructing the path circuit are extracted.

FIG. 12 illustrates a circuit 1200 with the forward-trace in FIG. 6, the backward-trace in FIG. 7 and the certain value propagation in FIG. 10 all together. In FIG. 12, paths that both forward-traced and backward-traced are overlapped are indicated with thin solid line with arrows. Paths that are either forward-traced or the backward-traced are indicated with doted line with arrows. Paths that the certain values are propagated are indicated with a thick solid line with arrows. FIG. 12 illustrates that there are the transistors traced forward and backward in the divided circuits 30, 31 and 32, and the transistors to which the certain value is not propagated effectively in the divided circuits 30, 31, 32 and 35. Therefore, a path circuit 50 containing the divided circuits 30, 31 and 32 is extracted as illustrated in FIG. 13 by the aforementioned processing in operation 1014.

The path circuit can be determined by the propagation path of the certain value. However, the transistor to which the certain value is not propagated exists in the divided circuit 35. Where determining the divided circuit constructing the path circuit by the propagation of the certain values, the divided circuit 35 along the path that starts from the input pin 40 and ends at the output pin 42 is unnecessary extracted as the divided circuit constructed the path circuit.

Figure 13:
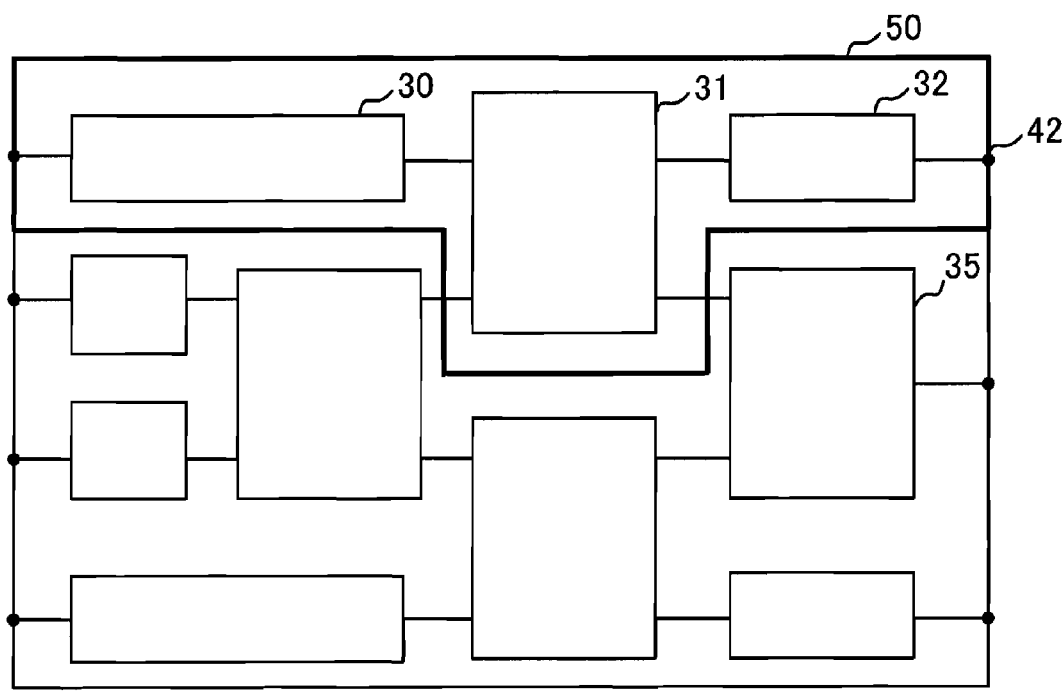
FIG. 13 illustrates an example of extracted path circuit.
Figure 14:
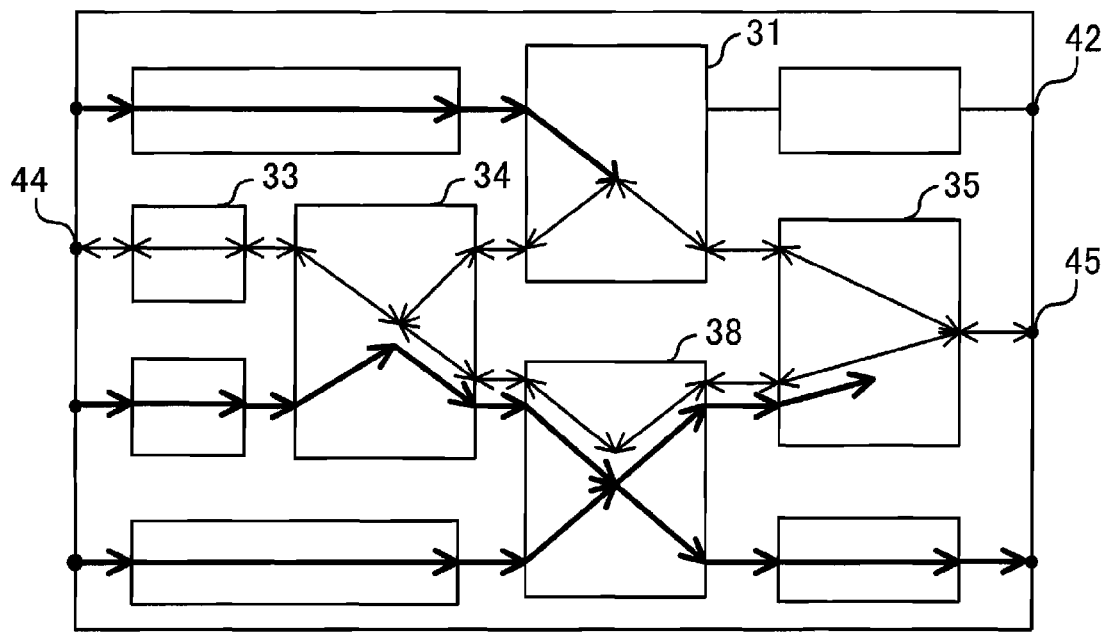
FIG. 14 illustrates an example of circuit extraction by a combination of the forward-trace and the backward-trace may be insufficient as an extraction condition.

As illustrated in FIGS. 12 and 13, the divided circuit 30, 31 and 32 constructing the path circuit can be extracted by the combination of the forward-trace and the backward-trace. However, where extracting divided circuits along a path that stats from the input pin 44 and ends at an output pin 45 only with logical AND of the forward-trace and the backward-trace, a divided circuit 38 is also extracted together with the divided circuits 33, 34, 31 and 35 as illustrated in FIG. 14. Where the certain values are propagated from the divided circuit 34 to the divided circuit 38, values at every path in the divided circuit 38 are determined. That is to say, all transistors in the divided circuit 38 are not applied to any of the transistors illustrated in FIGS. 11A to [ ]11C. Thus, the divided circuit 38 can be excluded from the path circuit by adding the certain value propagation to the path extraction conditions.

For the divided circuit 34, there is a path along which a value is not determined and a transistor that is applicable to the transistors illustrated in FIGS. 11A to [-] 11C, thus it is not excluded from the path circuit by adding the certain value propagation condition.

In operation 1016 illustrated in FIG. 3, the simulation auxiliary information is extracted. The simulation auxiliary information is the information on additive circuits connected with the I/O terminals of each divided circuit included in the path circuit extracted in operation 1014, however, not included in the extracted path circuit. When conducting the timing analysis only on the path circuit extracted in operation 1014, an impact of a signal delay in circuits adjacent to the divided circuit are not considered, as such adjacent circuits may reduce the accuracy of the circuit analysis result. In this embodiment, the accuracy of the timing analysis can be improved by adding the peripheral circuits to the path circuit.

Figure 15:
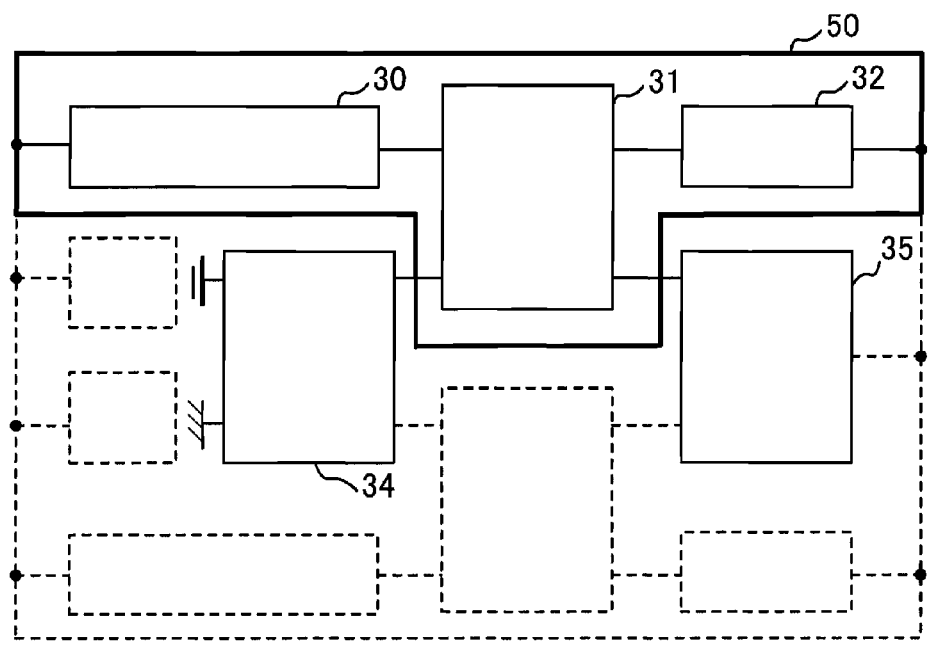
FIG. 15 illustrates an example of an auxiliary information extraction.

For example, as illustrated in FIG. 15, the divided circuits 34 and 35 are extracted as the auxiliary information for the path circuit 50 illustrated in FIG. 13. Since the divided circuit 34 connects with the input of the divided circuit 31 included in the path circuit 50, the input of the divided circuit 34 is clipped to the value 0 or 1 obtained by the propagation of the certain value in the operation 1012.

By conducting the SPICE simulation of the circuit constructed of the net list 22 and the simulation auxiliary information 24 of the path circuit thereby extracted, in other words, the partial circuit constructed of the divided circuits 30, 31, 32, 34 and 35 as illustrated in FIG. 15, an accurate timing analysis can be conducted within a reasonable time.

Figure 16:
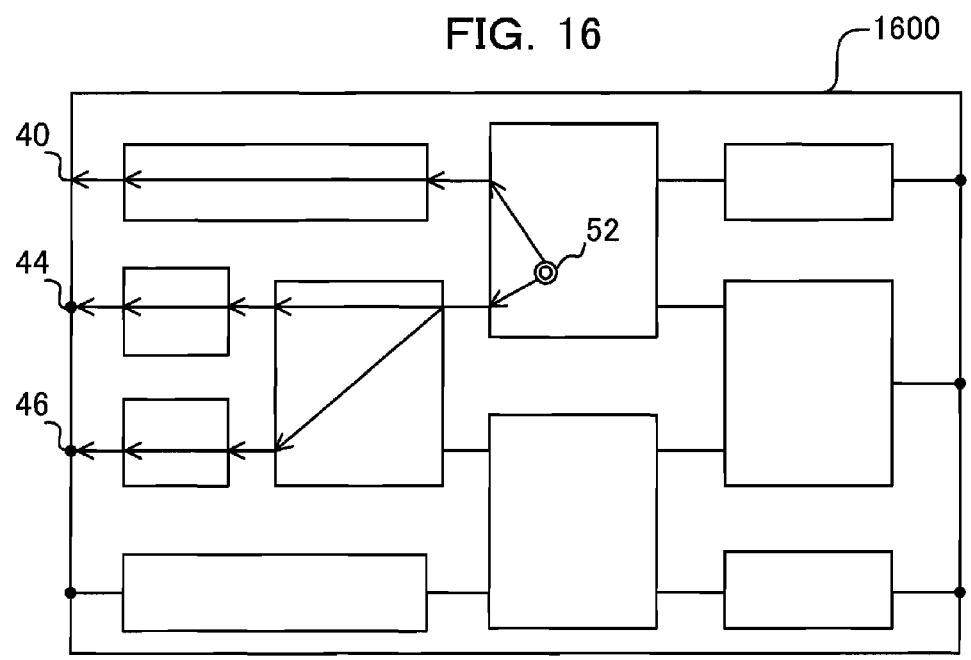
FIG. 16 illustrates a path input pin in a back trace.
Figure 17:
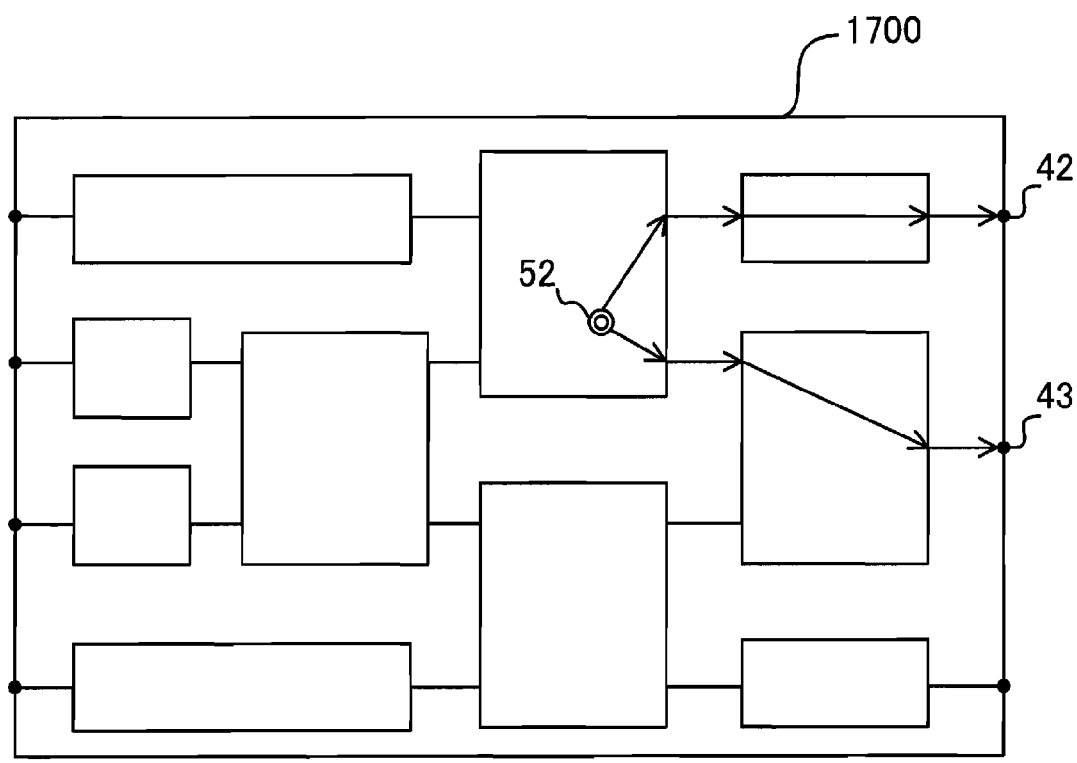
FIG. 17 illustrates a path input pin determination by tracing forward.

Alternatively, an internal node in the path circuit to be simulated can be specified instead of specifying the start point and the end point of the path in the path circuit targeted for the simulation. A detection of the path input pin in operation 1004 where specifying internal path nodes can be done by tracing the circuit backward from an internal node 52 specified as in circuit 1600 illustrated in FIG. 16 and determining the detected external input pins 40, 44 and 46 as the path input pins. A detection of the path output pin in operation 1006 can be done by tracing the circuit forward from the specified internal node 52 and determining the detected external output pins 42 and 43 as the path output pins.

Where the external input pin and the external output pin determined as described above exist more than one as illustrated in FIG. 16 and in the circuit 1700 illustrated in FIG. 17, the path circuit is determined in operations 1008, 1010, 1012 and 1014 as follows.

Where a plurality of path input pins are detected by tracing the circuit backward from the internal node, the circuit is traced forward from these path input pins in operation 1008 to detect the transistors along the forward-trace path. Likewise, where a plurality of the path output pins are detected by tracing the circuit forward from the internal node, transistors along the backward-trace path are determined by tracing the circuit backward from these path output pins in operation 1010.

In operation 1012, the unknown value X is input to one or more path input pins determined by the backward-trace from the internal node, and the certain value 0 or 1 is input to the other external input pins and then propagated the certain value and the unknown value.

In operation 1014, the divided circuit including at least one transistor to which is traced forward from the path input pins determined by the backward-trace from the internal node, traced backward from the path output pins determined by the forward-trace from the node, and the certain value is not propagated effectively, is extracted. In FIGS. 16 and 17, almost of all divided circuits are extracted. However, a practical large-scale logic circuit may be divided into a great number of divisions. Thus, extracting a part of the circuit is quite effective to conduct the timing analysis within a reasonable time.

Figure 18:
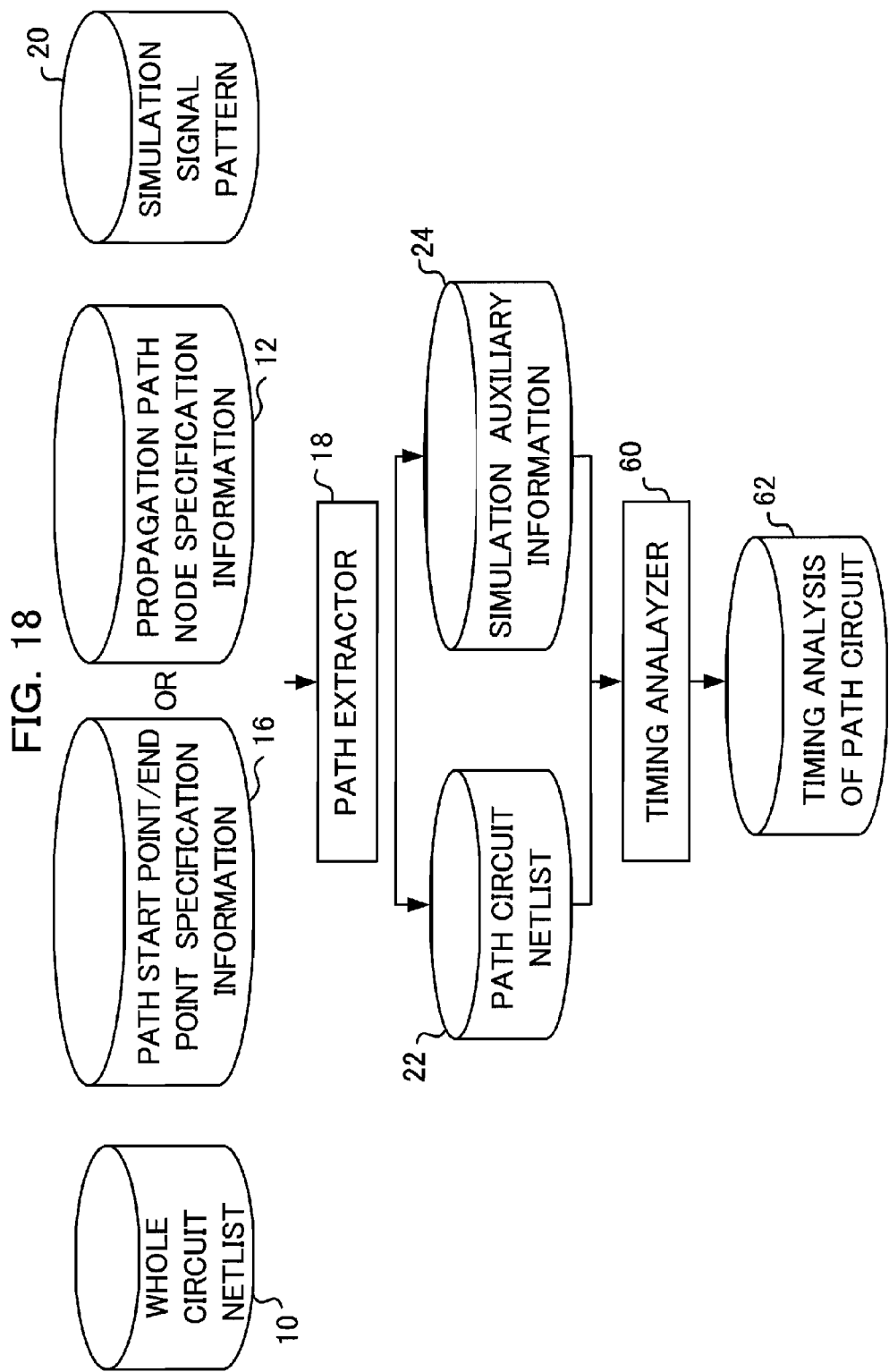
FIG. 18 illustrates an example system executing the simulation.

FIG. 18 illustrates a simulation system structure having a timing analyzer, e.g., a simulator, simulating the divided circuits extracted.

The path extractor 18 extracts the divided circuits from the whole circuit net list 10, the path start point/end point specification information 16 or the propagation path node specification information 12 and the simulation signal pattern 20, and then determines the net list 22 and the simulation auxiliary information 24 of the path circuit. A timing analyzer 60 conducts the timing analysis of the divided circuit extracted by the SPICE simulation and outputs a timing analysis result 52.

The embodiments can be implemented in computing hardware (computing apparatus) and/or software, such as (in a non-limiting example) any computer that can store, retrieve, process and/or output data and/or communicate with other computers. The results produced can be displayed on a display of the computing hardware. A program/software implementing the embodiments may be recorded on computer-readable media comprising computer-readable recording media. The program/software implementing the embodiments may also be transmitted over transmission communication media. Examples of the computer-readable recording media include a magnetic recording apparatus, an optical disk, a magneto-optical disk, and/or a semiconductor memory (for example, RAM, ROM, etc.). Examples of the magnetic recording apparatus include a hard disk device (HDD), a flexible disk (FD), and a magnetic tape (MT). Examples of the optical disk include a DVD (Digital Versatile Disc), a DVD-RAM, a CD-ROM (Compact Disc-Read Only Memory), and a CD-R (Recordable)/RW. An example of communication media includes a carrier-wave signal.

Further, according to an aspect of the embodiments, any combinations of the described features, functions and/or operations can be provided.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A simulation method of a logic circuit, the simulation method comprising:

dividing the logic circuit into a plurality of divided circuits using a processor;

determining a divided circuit forming a part of a path circuit that starts from an external input of the logic circuit and ends at an external output of the logic circuit;

extracting an auxiliary divided circuit from the plurality of divided circuits, the auxiliary divided circuit being electrically coupled with an I/O terminal of each divided circuit included in the path circuit and being not included in the path circuit; and executing a simulation of the logic circuit including the divided circuit constructing the path circuit and the auxiliary divided circuit.

2. The simulation method according to claim 1, wherein the divided circuit forming a part of the path circuit is determined, by determining a first transistor by tracing the logic circuit forward from an external input of the specified path, determining a second transistor by tracing the logic circuit backward from the external output of the specified path, determining a third transistor whose on/off state or values of a drain and a source are not determined, when an unknown value is input to the external input of the specified path and a certain value representing a simulation condition is input to the external input of the logical circuit excluding the external input of the specified path and the unknown value and the certain value are propagated through the logic circuit with logic of the circuit, and determining a divided circuit including at least one transistor that is applicable to all of the first transistor, the second transistor and the third transistor as a divided circuit forming a part of the path circuit.

3. The simulation method according to claim 1, wherein:

the divided circuit having the output connected with any of the input of the divided circuit forming a part of the path circuit and the certain value representing the simulation condition is input to the input thereof, however, not constructing the path circuit and the divided circuit having the input connected with any of the output of the divided circuit constructing the path circuit, however, not constructing the path circuit are determined as the auxiliary circuits.

4. The simulation method according to claim 1, further comprising:

determining the external input of the specified path by tracing the logic circuit backward from the specified node in the logic circuit, and determining the external output of the specified path by tracing the logic circuit forward from the specified node.

5. A simulator for simulating a logic circuit, the simulator comprising:

a divide unit of the simulator to divide the logic circuit into a plurality of divided circuits;

a first divided circuit determine unit to determine a divided circuit along a specific path circuit that starts from at least one external input of the logic circuit as a start point and ends at, at least, one external output of the logic circuit as an end point;

an auxiliary divided circuit extract unit to extract an auxiliary divided circuit from the plurality of divided circuits, the auxiliary divided circuit being electrically coupled with an I/O terminal of each divided circuit included in the path circuit and being not included in the path circuit; and a simulation unit to simulate the logic circuit constructed of the divided circuit constructing the path circuit and the auxiliary divided circuit.

6. The simulator according to claim 5, the first divided circuit determine unit comprising:

a first transistor set determine unit determining the first set of transistors along the path in the logic circuit traced forward from the external input of the specified path, a second transistor set determine unit determining the second set of transistors along the path in the logic circuit traced backward from the external output of the specified path, a third transistor set determine unit determining the third set of transistors whose on/off state, values of the drain and the source are not determined when the unknown value is input to the external input of the specified path and the certain value representing the simulation condition is input to the external input excluding the external input of the specified path of the logic circuit and the unknown value and the certain value are propagated through the logic circuit with logic of the circuit, and a second divided circuit determine unit determining the divided circuit including the transistor that is applicable to all first to third sets of the transistors as the divided circuit constructing the path circuit.

7. The simulator according to claim 5, the first divided circuit determine unit determining the divided circuit whose output connects with any of the input of the divided circuit constructing the path circuit and the certain value representing the simulation condition is input to the input thereof, not constructing the path circuit and the divided circuit having the input connecting with any of the output of the divided circuit constructing the path circuit, not constructing the path circuit as the auxiliary divided circuits.

8. The simulator according to claim 5, further comprising:

an external input determine unit determining the external input of the specified path by tracing the logic circuit backward from the specified node in the logic circuit; and an external output determine unit determining the external output of the specified path by tracing the logic circuit forward from the specified node.

9. A method for simulating a logic circuit, the method comprising:

dividing the logic circuit into a plurality of divided circuits using a processor;

tracing the logic circuit in a first direction from the external input of the logic circuit as the start point;

tracing the logic circuit in a second direction from the external output of the logic circuit as the end point;

judging an existence of an element in a divided circuit whose logic is not determined;

extracting the divided circuit including an element that traced in both the first direction and the second direction, and whose logic is not determined, as a divided circuit forming a part of a path circuit extracting an auxiliary divided circuit from the plurality of divided circuits, the auxiliary divided circuit being electrically coupled with an I/O terminal of each divided circuit included in the path circuit and being not included in the path circuit; and simulating the logic circuit including the extracted divided circuit constructing the path circuit and the auxiliary divided circuit.

* * * * *

UNITED STATES PATENT AND TRADEMARK OFFICE
CERTIFICATE OF CORRECTION

PATENT NO. : 8,307,312 B2  
APPLICATION NO. : 12/190477  
DATED : November 6, 2012  
INVENTOR(S) : Miki Terabe Page 1 of 1

It is certified that error appears in the above-identified patent and that said Letters Patent is hereby corrected as shown below:

Column 8, Line 47, In Claim 9, delete "circuit" and insert -- circuit; --, therefor.

Signed and Sealed this
Fifth Day of March, 2013

Teresa Stanek Rea
*Acting Director of the United States Patent and Trademark Office*